United States Patent [19]
Hill et al.

[11] Patent Number: 4,853,563
[45] Date of Patent: Aug. 1, 1989

[54] SWITCH INTERFACE CIRCUIT FOR POWER MOSFET GATE DRIVE CONTROL

[75] Inventors: Lorimer K. Hill, Cupertino; James A. Harnden, San Jose; Barry J. Concklin, Sunnyvale, all of Calif.

[73] Assignee: Siliconix Incorporated, Santa Clara, Calif.

[21] Appl. No.: 36,777

[22] Filed: Apr. 10, 1987

[51] Int. Cl.$^4$ .................. H03K 17/04; H03K 17/687
[52] U.S. Cl. ...................... 307/475; 307/270; 307/571; 307/581; 307/560
[58] Field of Search ................ 307/570–572, 307/574, 581, 270, 550, 568, 450, 475, 499, 501, 246, 318, 584, 566

[56] References Cited
U.S. PATENT DOCUMENTS

| | | | |
|---|---|---|---|
| 4,034,307 | 7/1977 | Schade, Jr. ........................... | 330/288 |
| 4,216,393 | 8/1980 | Gilberg et al. ....................... | 307/270 |
| 4,256,978 | 3/1981 | Pinckaers ............................. | 307/279 |
| 4,303,831 | 12/1981 | El Hamamsy ...................... | 307/571 |
| 4,492,883 | 1/1985 | Janutka ................................ | 307/571 |
| 4,575,642 | 3/1986 | Hochreutiner et al. ............ | 307/270 |

*Primary Examiner*—Stanley D. Miller
*Assistant Examiner*—Timothy P. Callahan
*Attorney, Agent, or Firm*—Skjerven, Morrill, MacPherson, Franklin & Friel

[57] ABSTRACT

A switch interface circuit provides control voltages to the gate of a power MOSFET while protecting the power MOSFET from breakdown caused by transient signals and over-voltage. In one embodiment, a large JFET acts as gate-source shunt and a small JFET serves as a current source to turn the power MOSFET off when the turn-on current is removed. The JFET gate-drain and gate-source breakdown provides a voltage limitation to protect the MOSFET from gate overvoltage. Alternatively, Zener diodes and MOS transistors are used in lieu of the JFET for shorting the power MOSFET gate to source during turn-off and limiting its gate to source voltage during turn-on.

27 Claims, 3 Drawing Sheets

NOTE: TURN-ON PULSE COULD BE THE ORDER OF 100 NS.

SWITCH INTERFACE CIRCUIT FOR POWER MOSFET GATE DRIVE CONTROL

BACKGROUND

This invention relates to a switch interface circuit and in particular to a switch interface circuit for control of gate voltage on a power metal oxide semiconductor field effect transistor (MOSFET) device.

A P-channel power MOSFET is ideally suited for use as a high voltage, high current switch where the source of the MOSFET is connected to a positive power supply and the drain of the MOSFET is connected to a load such as a motor, which in turn is referenced to ground, either through another MOSFET or directly. When a P-channel power MOSFET is used in this application, the gate of the MOSFET is driven negative with respect to the source in order to turn on the device. Using an N-channel power MOSFET in this application requires a second power supply, more positive than the first power supply, to bias the N-channel MOSFET gate in order to turn on the MOSFET. Despite the advantage of the negative gate threshold voltage of a P-channel MOSFET, problems remain in the design of an ideal high voltage gate drive circuit.

An ideal gate drive circuit would provide a short circuit between the power MOSFET gate and source when the power MOSFET is turned off, in order to eliminate the possibility of spurious (e.g., dV/dt induced) power MOSFET turn-on. The ideal gate drive circuit would consume zero standby current when the power MOSFET is turned on and when the power MOSFET is turned off. The ideal gate drive circuit would provide sufficient gate drive current during turn-on of the power MOSFET to achieve rapid switching and low switching power losses. The ideal gate drive circuit would limit the gate-to-source voltage of the power MOSFET to a value less than the breakdown voltage of the gate oxide. The ideal gate drive circuit would also provide isolation for, and easy connection to, low voltage logic circuits.

The simplest gate drive circuit is a resistor, in parallel with a Zener diode, connected between the gate and source of the P-channel power MOSFET. This circuit can be interfaced to low voltage logic by means of a switched current source connected between the gate of the power MOSFET and ground. Disadvantages of this circuit are the incompatible requirements of a low resistance between gate and source of the power MOSFET to reduce the possibility of dV/dt-induced turn-on of the power MOSFET when the power MOSFET is off, and a high resistance between the gate and source of the power MOSFET to reduce power dissipation when the power MOSFET is on. However, this circuit does consume zero power when the power MOSFET is turned off, allows high-current turn-on pulses, and limits the gate voltage of the power MOSFET to a safe value.

More complicated gate drive circuits include a low voltage negative power supply referenced to the high voltage power supply. This type of special power supply has been used to power logic circuits that drive the gate of the power MOSFET. Interface with ground-referenced low voltage logic has been provided by light-coupled circuits, such as opto couplers. This type of circuitry has many of the features desired in the gate drive circuit; however, circuit complexity and high cost are distinct disadvantages.

SUMMARY

According to this invention, a switch interface circuit provides control voltages to the gate of a power MOSFET while protecting the power MOSFET from breakdown caused by transient signals and overvoltage. In one embodiment, a relatively large junction field effect transistor (JFET) serves as a shunt between the gate and source of the power MOSFET, and a small JFET acts as current source to drive the large JFET. The gate-drain and gate-source breakdowns of the large JFET provide a voltage limitation to protect the MOSFET from gate overvoltage and gate-source breakdown. The gate-source breakdown of the large JFET also provides a current path for turning on the power MOSFET. Steady state on and off current of the switch interface circuit is minimized.

In another embodiment, the switch interface circuit includes a pair of Zener diodes that are connected to depletion mode transistors. In an alternative application, the small FET is replaced with a pair of enhancement mode MOSFETS. These form a current source which can be switched off when the power MOSFET is turned on, in order to reduce power consumption. The difference in Zener breakdown voltages of the two Zener diodes protects the P-channel power MOSFET from gate-source breakdown. Steady state on and off current of the switch interface circuit is further reduced by the use of this embodiment. In each of the embodiments, sufficient gate drive current is provided to achieve rapid switching of the power MOSFET.

It is, accordingly, an object of the present invention to provide an easy interface to low voltage logic levels.

It is another object of the present invention to provide fast turn on and turn off of high voltage power MOSFETs as well as for other types of insulated gate transistors.

It is another object of the present invention to provide tolerance of high slew-rate signals on the drain of the power MOSFET.

It is another object of the present invention to allow high voltage isolation of the power MOSFET from the control logic.

It is another object of the present invention to provide sufficient enhancement voltage for obtaining minimum on-resistance in the power MOSFET, while limiting the enhancement voltage to a safe value.

It is another object of the present invention to provide protection for the power MOSFET, and for the load, by maintaining the power MOSFET in the off state as a logic default condition.

BRIEF DESCRIPTION OF THE DRAWINGS

The invention will be described in greater detail with reference to the drawings in which.

DETAILED DESCRIPTION

Figure 1A:
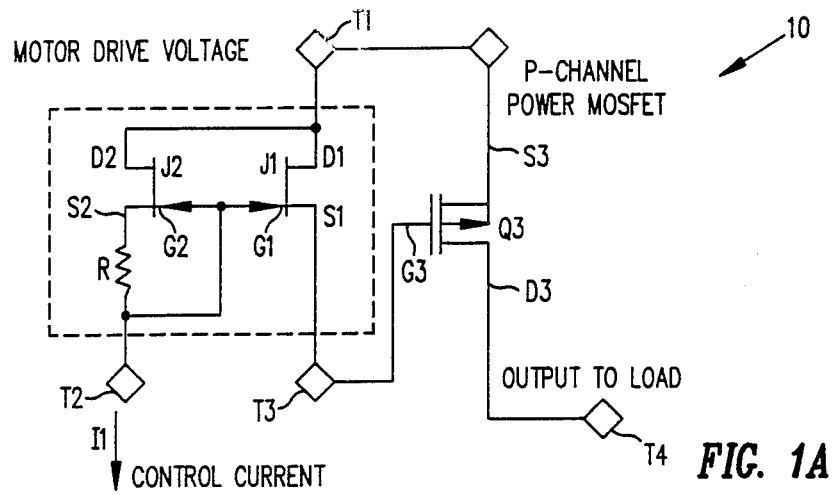
FIG. 1A is a schematic circuit diagram illustrating a switch interface circuit constructed in accordance with this invention.
Figure 1B:
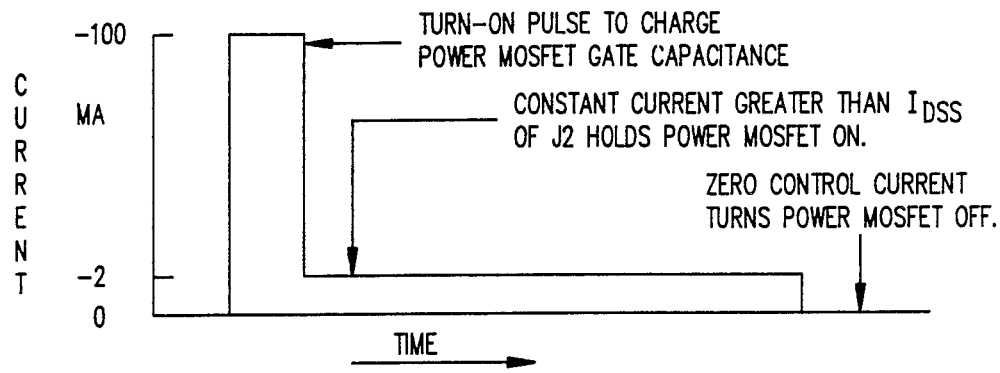
FIG. 1B is a timing diagram explanatory of FIG. 1A.

With reference to FIGS. 1A and 1B, a switch interface circuit 10 for use with a power supply (not shown) connected to terminal T1 for providing power to a load (not shown) connected to terminal T4, such as a motor, comprises relatively large JFET J1 (having a $R_{DS}$ (on) typically approximately 5 ohms) and relatively small JFET J2 (having $I_{DSS}$ typically approximately 1 milliampere) having their gate electrodes G1 and G2 connected to control current terminal T2. An input control current is provided via terminal T2 to gate G1 and G2 of JFETs J1 and J2, respectively, and an output signal is obtained from source S1 of JFET J1. The output signal from source S1 of JFET J1 is applied via terminal T3 to gate G3 of P-channel power MOSFET Q3, which turns on and provides a low impedance path between the power supply connected to terminal T1 and the load connected to terminal T4. Resistor R may, if desired, be coupled between input control current terminal T2 and source S2 of JFET J2 in order to allow adjustment of the magnitude and temperature coefficient of the saturation current of JFET J2 which is the pull-up current provided to gate G1 of JFET J1.

FET J1 is characterized by having a gate-source reverse breakdown voltage greater than its pinch-off voltage. Reverse breakdown voltage is that voltage which, when applied to reverse bias a PN junction of a field effect transistor, causes large currents to be drawn for relative small increases in voltage. Pinch-off voltage is defined as the gate-source voltage of a field effect transistor that blocks drain-source current for all drain-source voltages below the drain-source junction breakdown voltage.

The circuit of FIG. 1A operates in three specific modes: power MOSFET Q3 turned off; an initial control current pulse I1 applied to terminal T2 in order to turn on power MOSFET Q3; and a relatively low constant control current I1 applied to terminal T2 in order to maintain power MOSFET Q3 turned on. When control current I1 applied to control current terminal T2 is zero, current flows from power supply terminal T1 through drain D2 to source S2 of JFET J2, and in turn to gate G1 of JFET J1. With a positive voltage applied to gate G1 of JFET J1, JFET J1 turns on, connecting gate G3 of P-channel power MOSFET Q3 to power supply terminal T1. This provides zero voltage on gate G3 with respect to source S3 of power MOSFET Q3, thereby turning off power MOSFET Q3. In order to turn on power MOSFET Q3, a turn-on control current I1 pulse (typically 100 ma) is applied to control current terminal T2. This control current is greater than the current flowing between drain D2 and source S2 of JFET J2, and causes gate G1 to go negative with respect to source S1 of JFET J1, thereby pinching off JFET J1. With JFET J1 turned off, the positive voltage on power supply terminal T1 is no longer applied to gate G3 of power MOSFET Q3. The voltage on control current terminal T2 becomes sufficiently negative to cause Zener breakdown between source S1 and gate G1 of JFET J1, causing current to flow from gate G3 of power MOSFET Q3 through the source S1 and gate G1 zener diode of JFET J1 to control current terminal T2. This causes the voltage on gate G3 of power MOSFET Q3 to go negative, thereby turning on power MOSFET Q3.

Once power MOSFET Q3 has been turned on rapidly (typically 100 nanoseconds) by the relatively large control current I1 pulse, control current I1 is reduced to a significantly lower value (typically 2 m), but greater than the saturation current of JFET J2, in order to maintain power MOSFET Q3 in the on condition.

In switch interface circuit 10 of FIG. 1A, the gate-source shunt impedance of P-channel power MOSFET Q3 when MOSFET Q3 is off is the value of the drain to source resistance of JFET J1 when JFET J1 is on, which is sufficiently low (typically about 5 ohms) to prevent normal transients from the power supply connected to source S3 and the load connected to drain D3 of MOSFET Q3 from generating sufficient voltage on gate G3 of MOSFET Q3 to allow spurious turn-on of MOSFET Q3. With the embodiment illustrated in FIG. 1A, zero standby current between terminals T1 and T3 is obtained when power MOSFET Q3 is off. The standby current between terminals T1 and T2 when power MOSFET Q3 is on is typically 2 milliamperes. The value of the current between terminals T1 and T2 is determined by the saturation current of JFET J2, with an added current required to ensure breakdown between drain D1 and gate G1 of JFET J1.

Currents an order of magnitude larger than the current needed to maintain MOSFET Q3 on are used to charge the gate capacitance of power MOSFET Q3, thereby achieving the desired rapid turn on of MOSFET Q3. When the voltage on gate G1 of JFET J1 reaches the gate-drain breakdown voltage of JFET J1, excess current is carried by the gate-drain breakdown circuit of JFET J1 without further voltage increase. The zener diode formed between gate G1 and drain D1 of JFET J1 limits the overall negative excursion of the voltage on control terminal T2, thereby preventing excessive voltage from being applied to gate G3 of power MOSFET Q3. In this way, the gate-source voltage of power MOSFET Q3 is protected from overvoltage by the difference between the gate-drain breakdown voltage and the gate-source breakdown voltage of JFET J1. The relationship between the breakdown voltages of these transistors is expressed in the following equations:

$$\text{(minimum desired } V_{SG3}) < BV_{DG1} - BV_{SG1} < BV_{SG3} \tag{1}$$

$$BV_{SG1} > V_{P1}; \tag{2}$$

where $BV_{SG1}$ is the source to gate breakdown voltage of JFET J1;

$BV_{SG3}$ is the source to gate breakdown voltage of MOSFET Q3;

$BV_{DG1}$ is the drain to gate breakdown voltage of JFET J1;

$V_{SG3}$ is the source to gate voltage of MOSFET Q3; and $V_{P1}$ is the pinch off voltage of JFET J1.

Figure 2:
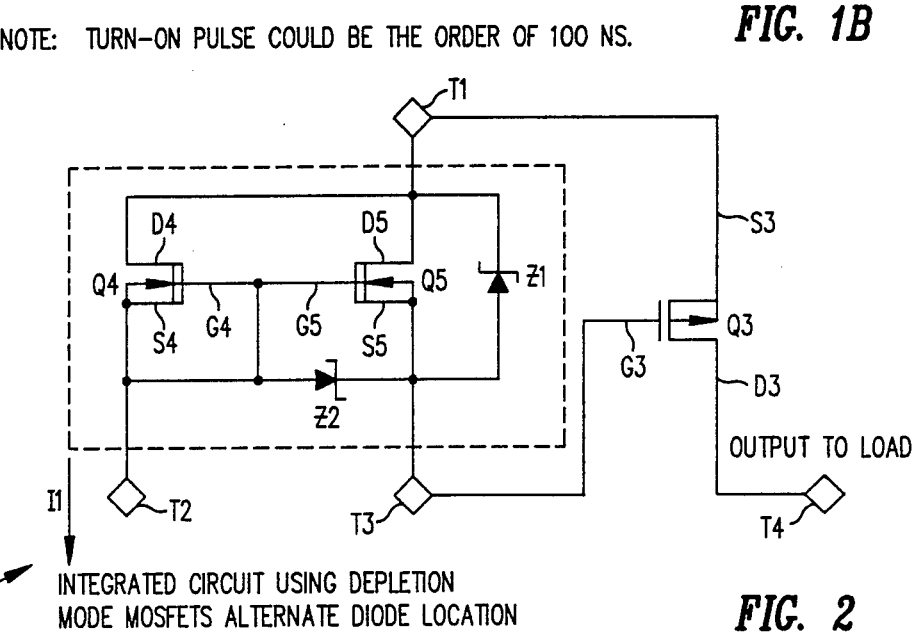
FIG. 2 is a schematic circuit diagram illustrating the use of depletion mode MOSFETs in a switch interface circuit constructed in accordance with this invention.

With reference to FIG. 2, another embodiment of the invention employs depletion mode MOSFETs Q4 and Q5 instead of JFETs J1 and J2 of the embodiment of FIG. 1A. N-channel depletion mode MOSFETs Q4 and Q5 have their gate electrodes G4 and G5 connected to the anode of Zener diode Z2. Source S4 of MOSFET Q4 is connected to control current terminal T2 and to the anode of Zener diode Z2, whereas source S5 of MOSFET Q5 is connected to the cathode of Zener Z2 and the anode of Zener diode Z1 and to gate G3 of P-channel enhancement mode power MOSFET Q3. The cathode of Zener diode Z1 is connected to drains D4 and D5 of MOSFETS Q4 and Q5 and to the power supply (not shown) via terminal T1. The bodies of depletion mode MOSFETs Q4 and Q5 are not necessarily connected to their sources S4 and S5, but may be biased to maintain the desired operation of the MOSFETs. If discrete MOSFETs are used, each MOSFET has its body connected to its source.

In input control current is provided via terminal T2 to gates G4 and G5 of MOSFETS Q4 and Q5, respectively, and an output signal is obtained from source S5 of MOSFET Q5. The output signal from source S5 of MOSFET Q5 is applied via terminal T3 to gate G3 of P-channel power MOSFET Q3, which turns on and provides a low impedance path between the power supply connected to terminal T1 and the load connected to terminal T4. A resistor or a transistor load device (not shown) may, if desired, be coupled between input control current terminal T2 and source S4 of MOSFET Q4 in order to allow adjustment of the magnitude and temperature coefficient of the saturation current of MOSFET Q4. Zener diode Z2 provides breakdown voltage greater than the pinch-off voltage of MOSFET Q5.

The circuit of FIG. 2 operates in three specific modes: power MOSFET Q3 turned off; an initial control current pulse I1 applied to terminal T2 in order to turn on power MOSFET Q3; and a relatively low constant control current I1 applied to terminal T2 in order to maintain power MOSFET Q3 turned on. When control current I1 applied to control current terminal T2 is zero, current flows from power supply terminal T1 through drain D4 to source S4 of MOSFET Q4, and in turn to gate G5 of MOSFET Q5. With a positive voltage applied to gate G5 of MOSFET Q5, MOSFET Q5 turns on, connecting gate G3 of P-channel power MOSFET Q3 to power supply terminal T1. This provides zero voltage on gate G3 with respect to source S3 of power MOSFET Q3, thereby turning off power MOSFET Q3. In order to turn on power MOSFET Q3, a turn-on control current I1 pulse (typically 100 ma) is applied to control current terminal T2. This control current I1 is greater than the current flowing between drain D4 and source S4 of MOSFET Q4, and causes gate G5 to go negative with respect to source S5 of MOSFET Q5, thereby pinching off MOSFET Q5. With MOSFET Q5 turned off, the positive voltage on power supply terminal T1 is no longer applied to gate G3 of power MOSFET Q3. The voltage on control current terminal T2 becomes sufficiently negative to cause Zener breakdown of Zener diode Z2, causing current to flow from gate G3 of power MOSFET Q3 through Zener diode Z2 to control current terminal T2. This causes the voltage on gate G3 of power MOSFET Q3 to go negative, thereby turning on power MOSFET Q3.

Once power MOSFET Q3 has been turned on rapidly (typically 100 nanoseconds) by the relatively large control current I1 pulse, control current I1 is reduced to a significantly lower value in order (typically 2 ma) to maintain power MOSFET Q3 turned on.

In switch interface circuit 20 of FIG. 2, the gate-source shunt impedance of P-channel power MOSFET Q3 when MOSFET Q3 is off is the value of the drain to source resistance of MOSFET Q5 when MOSFET Q5 is on, which is sufficiently low (typically about 5 ohms) to prevent normal transients from the power supply connected to source S3 and the load connected to drain D3 of MOSFET Q3 from generating sufficient voltage on gate G3 of MOSFET Q3 to allow spurious turn-on of MOSFET Q3. With the embodiment illustrated in FIG. 2, zero standby current between terminals T1 and T3 is obtained when power MOSFET Q3 is off. The standby current between terminals T1 and T2 when power MOSFET Q3 is on is typically 2 milliamperes. The value of the current between terminals T1 and T2 is determined by the saturation current of MOSFET Q4, with an added current required to ensure breakdown of Zener diode Z2.

Currents an order of magnitude larger than the current needed to maintain MOSFET Q3 on are used to charge the gate capacitance of power MOSFET Q3, thereby achieving the desired rapid turn on of MOSFET Q3. When the voltage on gate G3 of power MOSFET Q3 reaches the breakdown voltage of Zener diode Z1, excess current is carried by Zener diode Z1 without further voltage increase. Zener diode Z1 in series with Zener diode Z2 limits the overall negative excursion of the voltage on control terminal T2, thereby preventing excessive voltage from being applied to gate G3 of power MOSFET Q3. In this way, the gate-source voltage of power MOSFET Q3 is protected from overvoltage by the breakdown voltage of Zener diode Z1. The source to gate voltage of MOSFET Q5 is protected from overvoltage by the breakdown voltage of Zener diode Z2. Likewise, the drain to gate voltages of MOSFETS Q4 and Q5 are protected from over voltage by the sum of the breakdown voltages of Zener diodes Z1 and Z2. The relationship between the breakdown voltages of these components is expressed in the following equations:

$$BV_{Z1} < BV_{SG3} \quad (3)$$

$$BV_{SG5} > BV_{Z2} > V_{P5} \quad (4)$$

$$BV_{Z1} + BV_{Z2} < BV_{DG4} \quad (5)$$

$$BV_{Z1} + BV_{Z2} < BV_{DG5} \quad (6)$$

$$BV_{Z1} > (\text{minimum desired } V_{SG3}); \quad (7)$$

where $BV_{Z1}$ is the reverse breakdown voltages of Zener diodes Z1;
$BV_{Z2}$ is the reverse breakdown voltages of Zener diodes Z2;
$BV_{SG3}$ is the source to gate breakdown voltage of MOSFET Q3;
$BV_{SG5}$ is the source to gate breakdown voltage of MOSFET Q5;
$BV_{DG4}$ is the drain to gate breakdown voltage of MOSFET Q4; and
$BV_{DG5}$ is the drain to gate breakdown voltage of MOSFET Q5.

Figure 3A:
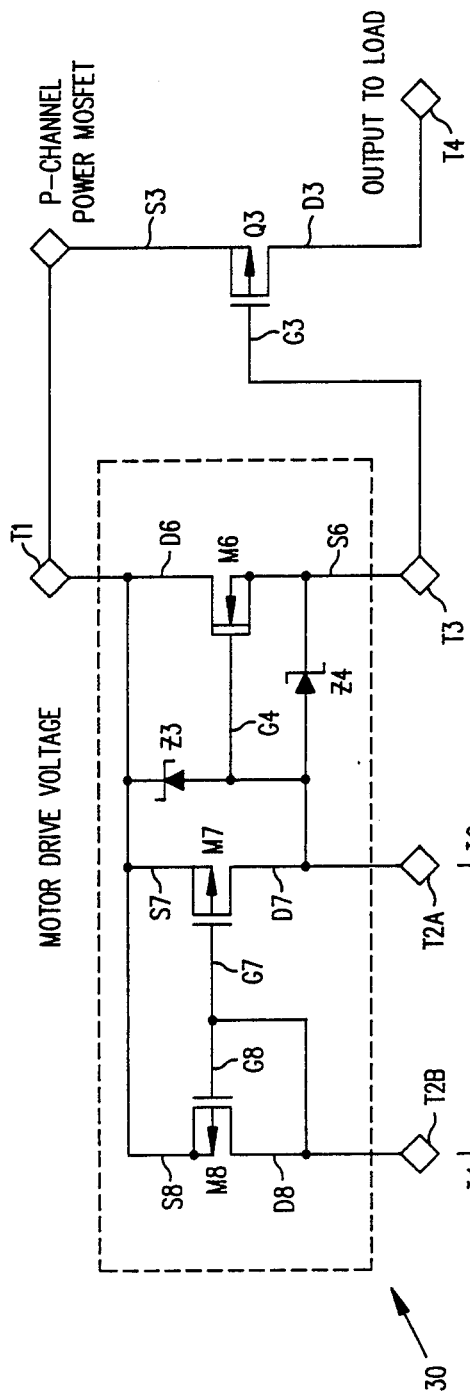
FIG. 3A is a schematic circuit diagram of an alternative embodiment of this invention using two control currents.
Figure 3B:
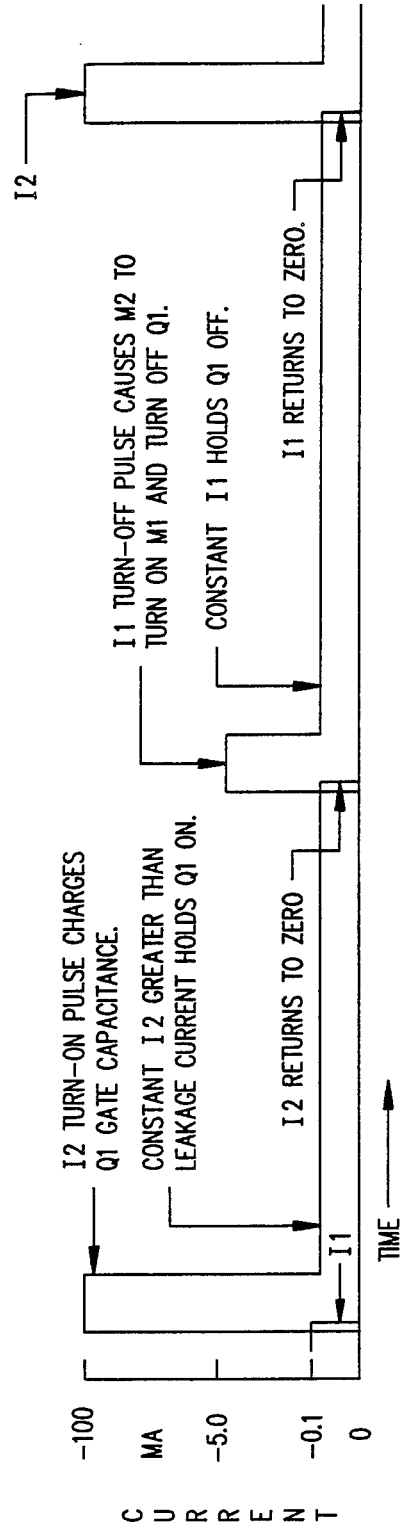
FIG. 3B is a timing diagram to aid in the explanation of the embodiment of FIG. 3A.

With reference to FIG. 3A, another embodiment of a switch interface circuit constructed in accordance with this invention is illustrated. The circuit of FIG. 3A includes Zener diodes Z3 and Z4, P-channel enhancement mode transistors M7 and M8 and N-channel depletion mode transistor M6. Gates G7 and G8 of P-channel enhancement mode transistors M7 and M8 and drain D8 of transistor M8 are connected to control current terminal T2B. Drain D7 of transistor M7, gate G6 of transistor M6, and the anodes of Zener diodes Z3 and Z4 are connected to control current terminal T2A. Sources S7 and S8 of transistors M7 and M8, the cathode of Zener diode Z3, and drain D6 of transistor M6 are connected via terminal T1 to the power supply (not shown). Source S6 of depletion mode transistor M6 and the cathode of Zener diode Z4 are connected to gate G3 of power MOSFET Q3, via terminal T3.

A turn-off input control current I1 is provided via terminal T2B to gates G7 and G8 of MOSFETS M7 and M8, respectively. A turn-on input control current I2 is provided via terminal T2A to drain D7 of MOSFET Q7, and an output signal is obtained from source S6 of MOSFET Q6. The output signal from source S6 of MOSFET Q6 is applied via terminal T3 to gate G3 of P-channel power MOSFET Q3, which turns on and provides a low impedance path between the power supply connected to terminal T1 and the load connected to terminal T4.

Switch interface circuit 30 of FIG. 3A operates in the same manner as switch interface circuit 20 of FIG. 2, with the following exceptions.

Figure 4A:
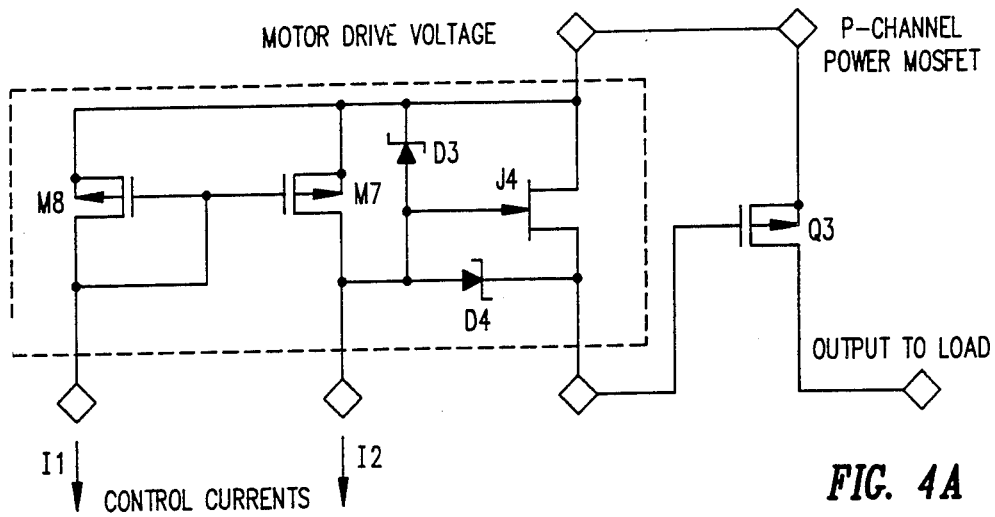
FIGS. 4A and 4B are schematic circuit diagrams illustrating variants of the embodiment of FIG. 3A.
Figure 4B:
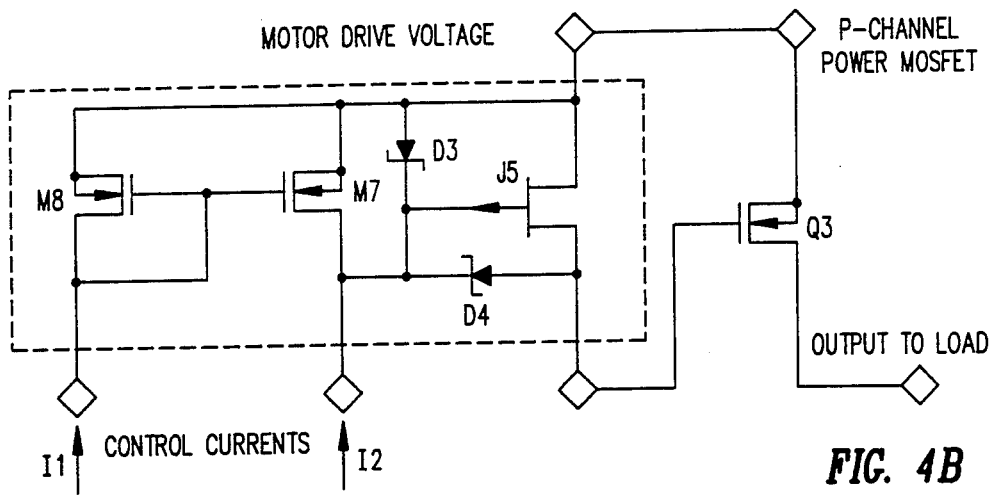
Figure 5:
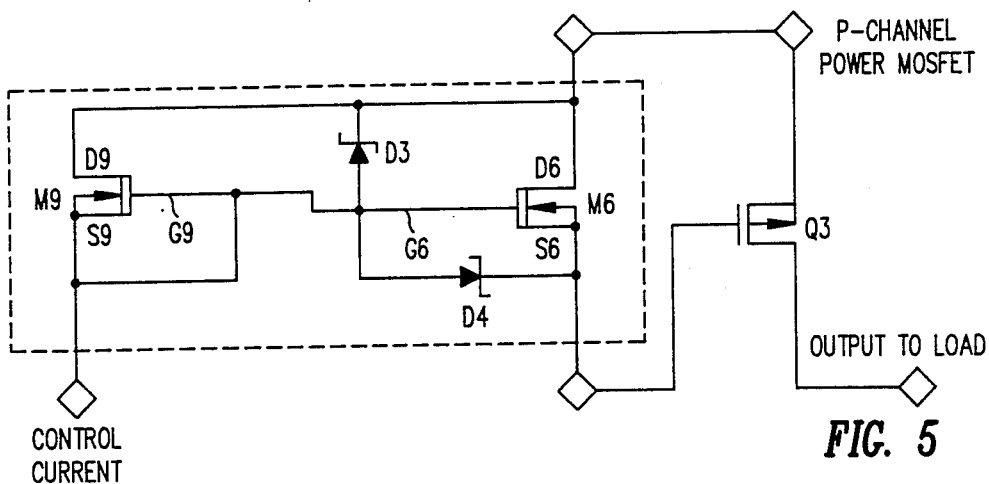
FIG. 5 is a schematic circuit diagram illustrating another variant of the embodiment of FIG. 3A.

To turn on power MOSFET Q3, a turn-on pulse of control current I2 is applied to control current terminal T2A in order to charge the gate capacitance of power MOSFET Q3. Control circuit I2 is pulsed to a high current value and causes gate G6 of transistor M6 to be pulled below the pinch-off voltage of transistor M6. Current flows through diode Z4 from the gate of P-channel power MOSFET Q3. After power MOSFET Q3 turns on, control current I2 is reduced to a constant holding current, which is greater than the leakage current between power supply terminal T1 and control current terminal T2A and sufficient to keep Zener diode Z3 in breakdown so that power MOSFET Q3 is maintained on. During the period that control current I2 is applied, control current I1 is zero. When power MOSFET Q3 is turned off, control current I2 is reduced to zero and control current I1 is pulsed to turn on transistor M7 which turns on depletion mode transistor M6 and turns off power MOSFET Q3. Control current I1 is reduced to a constant current which keeps transistor M7 turned on and holds power MOSFET Q3 off. Control current I1 then returns to zero upon the turn-on of control current I2. A bleeder FET (not shown) may be coupled between the gates and sources of transistors M8 and M7 to ensure the complete turn off of MOSFET M7 in the power MOSFET Q3 on state. The embodiment of the invention shown in FIG. 3A is also implementable with a JFET substituted for MOSFET M6. As shown in FIG. 4A, JFET J4 is an N-channel JFET. As shown in FIG. 4B, JFET J5 is a P-channel JFET. Yet another embodiment of the invention includes a variation of the embodiment shown in FIG. 3A. This embodiment as shown in FIG. 5 includes a second depletion mode FET such as MOSFET M9 with its drain D9 connected to the drain D6 of MOSFET M6, and its source S9 and gate G9 connected to gate G6 of MOSFET M6.

The invention disclosed herein enables implementation of a switch interface circuit in a single integrated circuit structure, if desired. The invention is applicable to either P-channel or N-channel power MOSFETS, including both types of conductivity modulated FETs, such as insulated gate transistors, (IGTs) and insulated gate bipolar transistors (IGBTs), by using complimentary components within the gate drive control circuit. Level translation from low voltage logic circuitry to high voltage-high current power MOSFET gate drive signals are easily and efficiently provided. Prevention of damage or destruction to the power MOSFET is realized in a simple and relatively inexpensive manner. The circuit can be driven by a high voltage NPN transistor or an N-channel power MOSFET, connected to low voltage logic on a separate integrated circuit or with dielectric isolation or other high voltage techniques on the same integrated circuit.

The specific embodiments of this invention described in this specification are intended to serve by way of example and are not a limitation on the scope of our invention. Numerous other embodiments of this invention will become apparent to those of ordinary skill in the art in light of the teachings of this specification.

What is claimed is:

1. A switch interface circuit for control of gate voltage on a power MOSFET having drain, source, and gate electrodes comprising:
   a first depletion mode FET having drain, source, and gate electrodes;
   a terminal connected to said gate electrode of said first depletion mode FET for receiving an input control current;
   means for connecting said source electrode of said first depletion mode FET to said gate electrode of said power MOSFET;
   means for limiting the source-to-gate voltage of said first depletion mode FET to a value greater than the pinch-off voltage of said first depletion mode FET and for conducting current while voltage limiting;
   means for limiting the drain-to-gate voltage of said first depletion mode FET to a value greater than said source-to-gate voltage of said first depletion mode FET by an amount sufficient to provide a voltage to said gate electrode of said power MOSFET; and
   means for connecting said gate of said first depletion mode FET to said drain of said first depletion mode FET.

2. A switch interface circuit as in claim 1 wherein said first depletion mode FET is an N-channel JFET.

3. A switch interface circuit as in claim 1 wherein said first depletion mode FET is an N-channel MOSFET.

4. A switch interface circuit as in claim 1 wherein said first depletion mode FET is a P-channel JFET.

5. A switch interface circuit as in claim 1 wherein said first depletion mode FET is a P-channel MOSFET.

6. A switch interface circuit as in claim 1 wherein said means for limiting the source-to-gate voltage of said first depletion mode FET comprises a Zener diode.

7. A switch interface circuit as in claim 1 wherein said means for limiting the drain-to-gate voltage of said first depletion mode FET comprises a Zener diode.

8. A switch interface circuit as in claim 1 wherein said means for connecting said gate of said first depletion mode FET to said drain of said first depletion mode FET comprises a resistor.

9. A switch interface circuit as in claim 1 wherein said means for connecting said gate of said first depletion mode FET to said drain of said first depletion mode FET comprises a current source.

10. A switch interface circuit as in claim 1 wherein said means for connecting said gate of said first depletion mode FET to said drain of said first depletion mode FET comprises:

a second depletion mode FET having drain, gate, and source electrodes;

means for connecting said drain of said second depletion mode FET to said drain of said first depletion mode FET; and means for connecting said gate and source of said second depletion mode FET to said gate of said first depletion mode FET.

11. A switch interface circuit as in claim 1 wherein said means for connecting said gate of said first depletion mode FET to said drain of said first depletion mode FET comprises:

a first enhancement mode FET having drain, gate, and source electrodes;

means for connecting said drain of said first enhancement mode FET to said gate of said first depletion mode FET;

means for connecting said source of said first enhancement mode FET to said drain of said first depletion mode FET; and means for selectively providing enhancement voltage to said gate electrode of said first enhancement mode FET.

12. A switch interface circuit as in claim 11 wherein said means for selectively providing enhancement voltage to said gate of said first enhancement mode FET comprises:

a second enhancement mode FET having drain, gate, and source electrodes;

means for connecting said drain and gate of said second enhancement mode FET to said gate of said first enhancement mode FET; and means for connecting said source of said second enhancement mode FET to said source of said first enhancement mode FET.

13. A switch interface circuit as in claim 1 wherein said switch interface circuit is a monolithic integrated circuit.

14. A switch interface circuit for control of gate voltage on a power MOSFET having drain, source, and gate electrodes comprising:

a first depletion mode FET having drain, source, and gate electrodes;

a terminal connected to said gate electrode of said first depletion mode FET for receiving an input control current;

means for connecting said source electrode of said first depletion mode FET to said gate electrode of said power MOSFET;

means for limiting the source-to-gate voltage of said first depletion mode FET to a value greater than the pinch-off voltage of said first depletion mode FET and for conducting current while voltage limiting;

means for limiting the drain-to-source voltage of said first depletion mode FET to a value sufficient to provide a voltage to said gate electrode of said power MOSFET; and means for connecting said gate of said first depletion mode FET to said drain of said first depletion mode FET.

15. A switch interface circuit as in claim 14 wherein said first depletion mode FET is an N-channel JFET.

16. A switch interface circuit as in claim 14 wherein said first depletion mode FET is an N-channel MOSFET.

17. A switch interface circuit as in claim 14 wherein said first depletion mode FET is a P-channel JFET.

18. A switch interface circuit as in claim 14 wherein said first depletion mode FET is a P-channel MOSFET.

19. A switch interface circuit as in claim 14 wherein said means for limiting the source-to-gate voltage of said first depletion mode FET is a Zener diode.

20. A switch interface circuit as in claim 14 wherein said means for limiting the drain-to-source voltage of said first depletion mode FET is a Zener diode.

21. A switch interface circuit as in claim 14 wherein said means for connecting said gate of said first depletion mode FET to said drain of said first depletion mode FET comprises a resistor.

22. A switch interface circuit as in claim 14 wherein said means for connecting said gate of said first depletion mode FET to said drain of said first depletion mode FET comprises a current source.

23. A switch interface circuit as in claim 14 wherein said means for connecting said gate of said first depletion mode FET to said drain of said first depletion mode FET comprises:

a second depletion mode FET having drain, gate, and source electrodes;

means for connecting said drain of said second depletion mode FET to said drain of said first depletion mode FET; and means for connecting said gate and source of said second depletion mode FET to said gate of said first depletion mode FET.

24. A switch interface circuit as in claim 14 wherein said means for connecting said gate of said first depletion mode FET to said drain of said first depletion mode FET comprises:

a first enhancement mode FET having drain, gate, and source electrodes;

means for connecting said drain of said first enhancement mode FET to said gate of said first depletion mode FET;

means for connecting said source of said first enhancement mode FET to said drain of said first depletion mode FET; and means for selectively providing enhancement voltage to said gate electrode of said first enhancement mode FET.

25. A switch interface circuit as in claim 24 wherein said means for selectively providing enhancement voltage to said gate of said first enhancement mode FET comprises:

a second enhancement mode FET having drain, gate, and source electrodes;

means for connecting said drain and gate of said second enhancement mode FET to said gate of said first enhancement mode FET; and means for connecting said source of said source enhancement mode FET to said source of said first enhancement mode FET.

26. A switch interface circuit as in claim 14 wherein said switch interface circuit is a monolithic integrated circuit.

27. A switch interface circuit as in claim 13 wherein the means for limiting the source-to-gate voltage and the means for limiting the drain-to-gate voltage are the gate, source, and drain regions of said first depletion mode FET.

* * * * *

UNITED STATES PATENT AND TRADEMARK OFFICE
CERTIFICATE OF CORRECTION

PATENT NO. : 4,853,563

DATED : August 1, 1989

INVENTOR(S) : Lorimer K. Hill, James A. Harnden, Barry J. Concklin

It is certified that error appears in the above-identified patent and that said Letters Patent is hereby corrected as shown below:

Col. 4, line 6, "typically 2m)" should read --typically 2ma)--

Col. 6, line 32, "over voltage" should read --overvoltage--

Signed and Sealed this

Twenty-seventh Day of March, 1990

Attest:

JEFFREY M. SAMUELS

Attesting Officer

Acting Commissioner of Patents and Trademarks